United States Patent
Joo et al.

(10) Patent No.: US 6,627,494 B2
(45) Date of Patent: Sep. 30, 2003

(54) METHOD FOR FORMING GATE ELECTRODE OF FLASH MEMORY

(75) Inventors: Kwang Chul Joo, Kyoungki-do (KR); Byung Kwon Ahn, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/751,447

(22) Filed: Jan. 2, 2001

(65) Prior Publication Data
US 2001/0044187 A1 Nov. 22, 2001

(30) Foreign Application Priority Data
Dec. 31, 1999 (KR) .......................... 1999-68095

(51) Int. Cl.⁷ .................. H01L 21/8242; H01L 21/20
(52) U.S. Cl. .................. 438/240; 438/257; 438/396
(58) Field of Search ................ 438/171, 190, 438/239, 240, 257, 308, 396

(56) References Cited

U.S. PATENT DOCUMENTS

| | | | | |
|---|---|---|---|---|
| 6,287,910 B2 | * | 9/2001 | Lee et al. | 438/240 |
| 6,291,343 B1 | * | 9/2001 | Tseng et al. | 438/653 |
| 6,303,481 B2 | * | 10/2001 | Park | 438/591 |
| 6,326,282 B1 | * | 12/2001 | Park et al. | 438/424 |
| 6,337,291 B1 | * | 1/2002 | Park et al. | 438/785 |
| 6,338,995 B1 | * | 1/2002 | Hwang et al. | 438/240 |
| 6,458,645 B2 | * | 10/2002 | DeBoer et al. | 438/240 |
| 2001/0036703 A1 | * | 11/2001 | Lee et al. | 438/225 |
| 2001/0036708 A1 | * | 11/2001 | Shin et al. | 438/396 |

* cited by examiner

*Primary Examiner*—Stephen D. Meier
*Assistant Examiner*—Pamela Perkins
(74) *Attorney, Agent, or Firm*—Pillsbury Winthrop LLP

(57) ABSTRACT

The present invention discloses a method for forming a gate electrode of a flash memory. A tunnel oxide film is formed on the whole surface of a semiconductor substrate. A conductive film of a floating gate is formed over the resultant structure. A gate insulation film is formed by depositing a TaON film on the conductive film for the floating gate. A conductive film for a control gate is formed on the gates insulation film. The conductive film for the control gate, the gates insulation film, the conductive film for the floating gate and the tunnel oxide film are patterned according to a photolithography process using a gate mask, thereby forming a gate electrode. Thus, the TaON film having a high dielectric constant and a stabilized bonding structure is used as the insulation material between the floating gate and the control gate. As a result, an oxidization reactivity with the floating gate is reduced, and a thickness of an equivalent oxide film is decreased, thereby obtaining a high capacitance.

18 Claims, 1 Drawing Sheet

METHOD FOR FORMING GATE ELECTRODE OF FLASH MEMORY

BACKGROUND OF THE INVENTION

1. Field of the Invention

The present invention relates to a method for fabricating a flash memory and, in particular, to an improved method for forming a gate electrode of a flash memory having improved electrical properties, using a TaON film having a high dielectric constant and superior film qualities as the gate insulation film.

2. Description of the Background Art

In general, a flash electrically programmable erasable read only memory (EEPROM), which has been widely employed as a nonvolatile memory, can be electrically programmed to add data and electrically erased to remove data.

The programming operation of the EEPROM serves to increase the threshold voltage of the cell transistor by forming channel hot electrons at the drain side and accumulating the electrons in a floating gate.

Conversely, the erase operation of the EEPROM reduces the threshold voltage of the cell transistor by generating a high voltage between a source/substrate and the floating gate, and discharging the electrons that had been accumulated in the floating gate.

In order to achieve higher levels of integration of semiconductor devices, extensive efforts have been made to reduce both the cell area and the operating voltage.

Accordingly, the flash memories have tended to use a nitride-oxide (NO) or oxide-nitride-oxide (ONO) structure as the gate insulation film, rather than a general silicon oxide ($SiO_2$) film.

In a process of fabricating the cell transistor for a flash memory using the NO or ONO dielectric material, the NO or ONO structure formation includes growing an oxide film on the polysilicon floating gate using a high temperature thermal oxidization method.

However, the resulting oxide film is non-uniform at the polysilicon interface of the lower floating gate, thereby increasing the thickness of an equivalent oxide film ($T_{ox}$). As a result, the cell capacitance of the flash memory is decreased.

Therefore, in order to obtain sufficient capacitance for high capacity and high integration memory products, research and development efforts have been made to replace NO or ONO with $Ta_2O_5$ to provide a higher dielectric constant.

However, $Ta_2O_5$ has an unstable stoichiometry, and thus vacancy Ta atoms exist in a thin film as a result of variations in the ratio of Ta and O atoms in the deposited layer. Further carbon atoms, carbon compounds ($CH_4$, $C_2H_4$, etc.) and water ($H_2O$) are generated during the deposition of the $Ta_2O_5$ layer by side reactions between the organic components of the organometallic precursor compound, such as $Ta(OC_2H_5)$, and the $O_2$ (or $N_2O$) gas within the LPCVD chamber. These contaminants are, in turn, incorporated into the $Ta_2O_5$ film.

As a result, the leakage current of the whole cell gate electrodes is increased and the dielectric properties are degraded by the contaminants including oxygen vacancies, carbon and carbon compounds, ions and radicals remaining in the the $Ta_2O_5$ film.

In order to remove such impurities from the $Ta_2O_5$ film, a low temperature thermal treatment (for example, plasma $N_2O$ or UV-$O_3$) is typically performed two or three times, thereby complicating the fabrication process. In addition, the $Ta_2O_5$ film can act as an oxidizer and thus tends to form an oxide film at the interface between the $Ta_2O_5$ film and the floating gate, thereby reducing the capacitance of the resulting flash memory cell gate electrode.

SUMMARY OF THE INVENTION

Accordingly, a primary object of the present invention is to provide a method for forming a gate electrode for a flash memory which can obtain a high capacitance by using a dielectric film having a high dielectric constant.

Another object of the present invention is to provide a method for forming a gate electrode for a flash memory that will improve the electric properties of the resulting cell transistor in the flash memory.

In order to achieve the above-described objects of the present invention, a method for forming a gate electrode of a flash memory comprises the steps of: providing a semiconductor substrate; forming a tunnel oxide film on the whole surface of the semiconductor substrate; forming a conductive film for a floating gate on the tunnel oxide film; forming a TaON film on the conductive film for the floating gate; forming a conductive film for a control gate on the TaON film; and forming a gate electrode, by patterning and etching the conductive film for the control gate, the TaON film, the conductive film for the floating gate and the tunnel oxide film using a gate mask.

In addition, a method for forming a gate electrode for a flash memory comprises the steps of: providing a semiconductor substrate; forming a tunnel oxide film on the whole surface of the semiconductor substrate; forming a conductive film for a floating gate on the tunnel oxide film; nitriding or nitride-oxidizing the surface of the conductive film for the floating gate, before depositing a TaON film; forming the TaON film on the nitrided or nitride-oxidized conductive film for the floating gate; nitriding or nitride-oxidizing the surface of the conductive film for the floating gate, after depositing the TaON film; crystallizing the nitrided or nitride-oxidized TaON film using a thermal treatment; forming a conductive film for a control gate on the TaON film; and forming a gate electrode, by patterning and etching the conductive film for the control gate, the TaON film, the conductive film for the floating gate and the tunnel oxide film.

BRIEF DESCRIPTION OF THE DRAWINGS

The present invention will become better understood with reference to the accompanying figures which are given only by way of illustration and thus are not intended to limit the present invention unnecessarily.

DETAILED DESCRIPTION OF THE PREFERRED EMBODIMENTS

A method for forming a gate electrode for a flash memory in accordance with the present invention will now be described in detail with reference to the accompanying figures.

Figure 1:
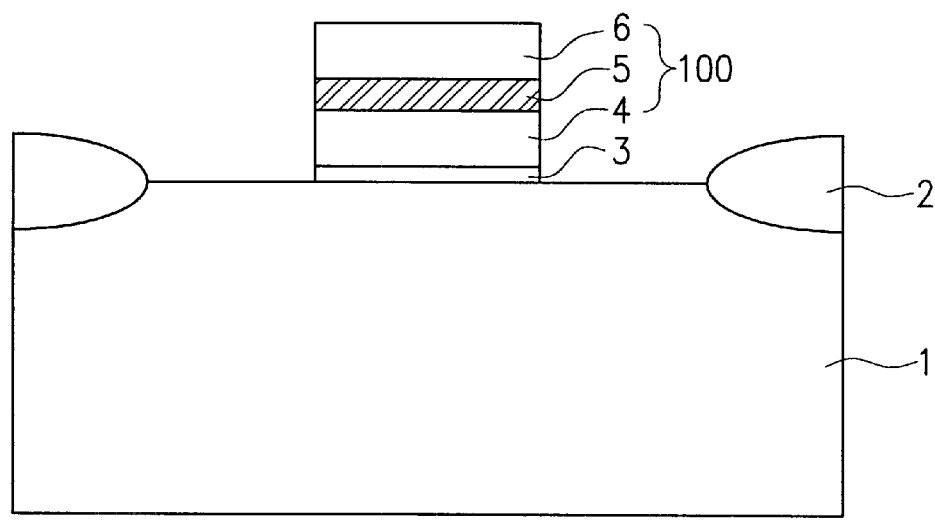
FIG. 1 is a cross-sectional diagram illustrating a method for forming a gate electrode for a flash memory in accordance with a first embodiment of the present invention.

As illustrated in FIG. 1, a field oxide film 2 is formed on a semiconductor substrate 1 to define active and non-active regions.

A tunnel oxide film 3 is then formed on the whole surface of the semiconductor substrate 1, and a conductive film 4, preferably a doped polysilicon, is then deposited on the tunnel oxide film 3 for forming a floating gate.

A TaON film 5 is then deposited on the conductive film 4. The TaON film 5 preferably comprises about 150 Å of amorphous TaON that is deposited on the wafer using a surface chemical reaction.

The deposition process of the TaON film 5 will now be briefly explained.

Ta chemical vapor for the deposition process is obtained by supplying a fixed quantity of a Ta compound or compounds (for example, $Ta(OC_2H_5)_5$) through a mass flow controller (MFC), and evaporating the compound in an evaporator at a temperature generally between 150 and 200° C.

Predetermined quantities of the Ta chemical vapor and an $NH_3$ reaction gas are then supplied to a low pressure chemical vapor deposition (LPCVD) chamber maintained at 300 to 600° C. under conditions that will induce the desired surface chemical reaction, thereby depositing an amorphous TaON film 5.

Thereafter, an annealing process is performed on the amorphous TaON film 5 both to increase its dielectric constant and to enhance its bonding force, thereby crystallizing the amorphous TaON film 5.

Preferably this annealing process involves treating, the TaON film 5 at 650 to 950° C. for 30 seconds to 30 minutes using a rapid thermal treatment, annealed at 650 to 950° C. for 5 seconds to 30 minutes using an electric furnace, or annealed for 1 minute to 30 minutes in a plasma reactor under an atmosphere of $N_2O$, $O_2$ or $N_2$.

A doped polysilicon layer is then deposited on the amorphous TaON film 5 as a conductive film 6 for a control gate.

The conductive film 6, the TaON film 5, the conductive film 4 and the tunnel oxide film 3 are then patterned and etched using conventional photolithography and etch processes using a gate mask, thereby forming a gate electrode 100.

Here, both the conductive film 4 and the conductive film 6 may be formed by depositing a single layer of doped polysilicon or a metal material, or by forming a stacked structure including both a doped polysilicon and a metal material. Preferably, the metal material is selected from the group consisting of TiN, TaN, W, WN, WSi, Ru, $RuO_2$, Ir, $IrO_2$ and Pt.

If the conductive film 4 is a doped polysilicon, an additional hemispherical grain (HSG) polysilicon growth process can be used to increase the effective surface area and thereby increase the capacitance.

Additionally, a natural oxide film and particles on the conductive film 4 may be removed using a dry cleaning process using HF vapor, preferably in-situ, or using a wet cleaning process using an HF solution, before depositing the amorphous TaON film 5.

In addition, an interface treatment using $NH_4OH$ or $H_2SO_4$ solution may be performed before and/or after the cleaning process using the HF compound in order to clean the interface of the conductive film 4 and improve the homogeneity of the resulting film.

Accordingly, when the TaON film ($\epsilon=20\sim25$) is used as the gate insulation film for the cell transistor in a flash memory, it provides a significantly higher dielectric constant than the conventional NO or ONO structures ($\epsilon=4\sim5$). Further, the TaON film provides a more stable chemical bonding structure than the conventional $Ta_2O_5$ film ($\epsilon=20\sim25$), and thus has little oxidization reactivity with the floating gate and the control gate.

As compared with the gate electrode using the ONO or $Ta_2O_5$, the present invention can reduce the thickness of the equivalent oxide film $T_{ox}$, thereby obtaining an increased capacitance.

Especially, the TaON film has a more stable Ta—O—N structure than the $Ta_2O_5$ film, which has an unstable stoichiometry. As a result, the TaON film is resistant to external electric impact (ESD), has a higher insulation breakdown voltage, and has a smaller leakage current from the floating gate.

An alternative method for forming the gate electrode for a flash memory in accordance with the second embodiment of the present invention will now be described with reference to FIG. 2.

Figure 2:
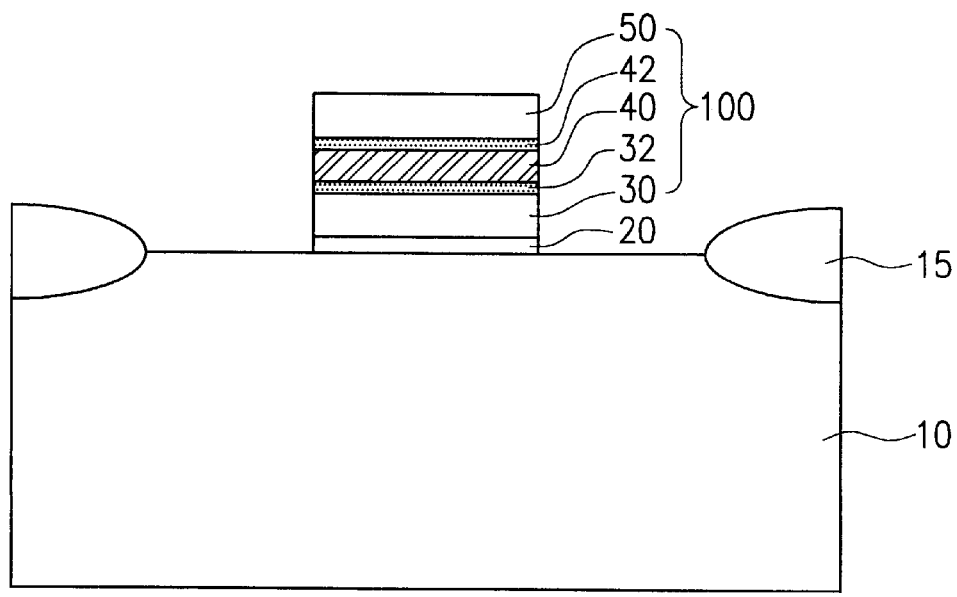
FIG. 2 is a cross-sectional diagram illustrating a method for forming a gate electrode for a flash memory in accordance with a second embodiment of the present invention.

As illustrated in FIG. 2, a field oxide film 15, a tunnel oxide film 20 and a conductive film 30 for a floating gate are sequentially formed on a semiconductor substrate 10, in a manner identical to the corresponding steps of the first embodiment of the present invention.

The conductive film 30 for the floating gate is then nitrided or nitride-oxidized in order to prevent or suppress the formation of a low dielectric oxide film (namely, increasing the oxidization resistance), thereby forming an SiN or SiON film 32. The thickness of the SiN film (or SiON film) 32 typically ranges from 5 to 20 Å. The nitriding process may be performed in-situ at 300 to 600° C. for 30 seconds to 10 minutes in an atmosphere of $NH_3$ or $N_2/H_2$ using a plasma, performed at 650 to 950° C. using a rapid thermal treatment, or performed at 500 to 1000° C. in an $NH_3$ atmosphere using an electric furnace.

Alternatively, the nitride-oxidizing process may be performed in-situ at 300 to 950° C. in $N_2O$ atmosphere using plasma or by performing a rapid thermal treatment.

As described above, the SiN or SION film 32 formed on the conductive film 30 serves to prevent or suppress the generation of a natural oxide film, thereby improving leakage current properties.

Additionally, the conductive film 30 may be oxidized in an atmosphere of $N_2O$ or $O_2$ using plasma or by performing a rapid thermal treatment before depositing the TaON film.

Thereafter, a gate insulation film is formed by depositing an amorphous TaON film 40 on the conductive film 30 which was previously nitrided or nitride-oxidized.

Thereafter, the TaON film 40 may be nitrided or nitride-oxidized in order to have a homogeneous surface. At this time, an SiN or SION film 42 formed on the surface of the TaON film 40 will prevent or suppress the oxidization of and charge transfer from the control gate subsequently formed, corrects structural defects such as micro cracks and pin holes at the interface of the amorphous TaON film 40, and improves the film homogeneity.

The nitriding or nitride-oxidizing process may be performed in-situ at 200 to 600° C. in an atmosphere of $NH_3$, $N_2/H_2$ or $N_2O$ using plasma, or performed at 650 to 950° C. for 30 seconds to 30 minutes in an atmosphere of $NH_3$ (or $N_2/H_2$ or $N_2O$) using a rapid thermal treatment, or by using an electric furnace.

In addition, the amorphous TaON film 40 may be oxidized at 300 to 600° C. in an atmosphere of $N_2O$ or $O_2$ using plasma to simultaneously carry out the surface treatment and crystallization.

Alternatively, the amorphous TaON film 40 may crystallized by performing an annealing process at 600 to 950° C. in an atmosphere of $N_2O$ or $O_2$ using an electric furnace or a plasma reactor.

In this case, the annealing process removes carbon compounds and oxygen vacancies generated during the deposition of the TaON film and induces crystallization of the TaON film, and thereby produces a high density dielectric film. After the deposition of the amorphous TaON film 40, the surface of the amorphous TaON film 40 is oxidized and crystallized in an atmosphere of $O_2$ and $N_2$ by fixing the flow rates of the $O_2$ and $N_2$ gases to achieve a $O_2$:$H_2$ mole ratio of not more than about 3:1.

A conductive film 50 for a control gate is then formed on the crystallized TaON film 40. The conductive film 50, the SiN film (or SiON film) 42, the TaON film 40, the SiN film (or SiON film) 32, the conductive film 30 and the tunnel oxide film 20 are then patterned and etched according to conventional photolithography and etch processes using a gate mask to form gate electrode 200, thus completing the formation of the gate electrode for the flash memory.

As discussed earlier, in accordance with the second embodiment of the present invention, the nitriding (or nitride-oxidizing) process is carried out befor and/or after the deposition of the amorphous TaON film, thereby providing the desired surface treatment and inducing crystallization of the conductive film for the floating gate and/or the amorphous TaON film.

Accordingly, the oxidization reaction at the interface between the TaON film and the floating gate and the TaON film and the control gate is efficiently restricted by the SiN films formed at the upper and lower portions of the TaON film, and thus the thickness of the equivalent oxide ($T_{ox}$) film is reduced below 30 Å, as a result of the homogeneous and non-oxidized interfaces.

As described above, the method for forming the gate electrode of the flash memory in accordance with the present invention has the following advantages.

The TaON film having the Ta—O—N structure is employed as the gate insulation film of the flash memory. It is more stable than a $Ta_2O_5$ film having an unstable stoichiometry. In addition, the leakage current is reduced, and a high insulation breakdown voltage and sufficient capacitance are provided for supporting proper device operation.

Moreover, the crystallization of the amorphous TaON film is performed using a high temperature thermal treatment, thus enhancing the bonding force of the amorphous TaON film. As a result, a physical chemical property of the gates insulation film is not degraded during the formation of the control gate electrode. Further, the crystallized TaON film has a relatively higher dielectric constant than the deposited amorphous TaON film.

In addition, when the nitriding (or nitride-oxidizing) process is carried out before and/or after the deposition of the amorphous TaON film, the low dielectric oxide film at the interface of the TaON film is not generated because oxygen diffusion at the interface between the floating gate and the control gate is prevented or suppressed thereby achieving homogeneity of the TaON interface. As a result, the electrical properties of the resulting cell transistor for the flash memory is improved.

As the present invention may be embodied in several forms without departing from the spirit or essential characteristics thereof, it should also be understood that the above-described embodiments are not necessarily limited to any of the specific details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a gate electrode for a flash memory, comprising:
   providing a semiconductor substrate;
   forming a tunnel oxide film on the semiconductor substrate;
   forming a first conductive film on the tunnel oxide film;
   forming a TaON film on the first conductive film;
   crystallizing the TaON film by annealing the TaON film at 600 to 950° C. in an atmosphere of $N_2O$ or $O_2$ by using an electric furnace or plasma in in-situ or ex-situ;
   forming a second conductive film on the crystallized TaON film;
   forming a gate electrode pattern, the gate electrode pattern serving as an etch mask; and
   etching the second conductive film, the TaON film, the first conductive film, and the tunnel oxide film to form a gate electrode.

2. The method according to claim 1, further comprising increasing the oxidation resistance of the first conductive film by nitriding or nitride-oxidizing the surface of the first conductive film before forming the TaON film.

3. The method according to claim 2, wherein increasing the oxidation resistance of the first conductive film further comprises nitriding the first conductive film by
   exposing the first conductive film to a plasma at 300 to 600° C. for between 30 seconds and 10 minutes under an atmosphere comprising $NH_3$ or $N_2/H_2$,
   exposing the first conductive layer to an atmosphere comprising $NH_3$ at 650 to 950° C. using a rapid thermal treatment apparatus, or
   exposing the first conductive layer to an atmosphere comprising $NH_3$ at 500 to 1000° C. using an electric furnace.

4. The method according to claim 2, wherein increasing the oxidation resistance of the first conductive film further comprises nitride-oxidizing the first conductive film by
   exposing the first conductive film to a plasma at 650 to 950° C. minutes under an atmosphere comprising $N_2O$, or
   exposing the first conductive layer to an atmosphere comprising $N_2O$ at 650 to 950° C. using rapid thermal treatment apparatus.

5. The method according to claim 1, further comprising removing a natural oxide film and particles on the first conductive film using a HF cleaning process,
   the HF cleaning process comprising a dry cleaning process using HF vapor or a wet cleaning process using an HF solution,
   the HF cleaning process being completed before depositing the amorphous TaON film.

6. The method according to claim 5, further comprising performing at least one surface treatment using an $NH_4OH$ or a $H_2SO_4$ solution, wherein performing at least one surface treatment is completed after forming the first conductive film and before forming the TaON film.

7. The method according to claim 1, further comprising oxidizing the surface of the first conductive film before forming the TaON film, wherein the first conductive film is oxidized by exposing the first conductive film to a plasma under an atmosphere comprising $N_2O$ or $O_2$ at between 300–600° C. or exposing the first conductive film to an atmosphere comprising $N_2O$ or $O_2$ at between 650–1000° C. using rapid thermal treatment apparatus.

8. The method according to claim 1, wherein forming the TaON film further comprises:

supplying, through a mass flow controller, a controlled quantity of one or more Ta compounds to an evaporator, and evaporating the Ta compounds at a temperature ranging from about 150 to about 200° C. to obtain a Ta chemical vapor.

9. The method according to claim 8, wherein forming the TaON film further comprises:

supplying a controlled quantity of the Ta chemical vapor to a low pressure chemical vapor deposition chamber, supplying a controlled quantity of a reaction gas, the reaction gas comprising $NH_3$ to the low pressure chemical vapor deposition chamber, maintaining the low pressure chemical vapor deposition chamber between 300 and 600° C., and inducing a surface chemical reaction to form an amorphous TaON film.

10. The method according to claim 1, further comprising nitriding the surface of the TaON film by performing an annealing process at 200 to 600° C. in an atmosphere comprising $NH_3$ or $N_2/H_2$ using an in-situ plasma process, or nitride-oxidizing the surface of the TaON film by performing an annealing process at 200 to 600° C. in an atmosphere comprising $N_2O$ using an in-situ plasma process, after depositing the TaON film.

11. The method according to claim 10, further comprising crystallizing the TaON film by oxidizing the TaON film in a plasma at 300 to 600° C. in an atmosphere comprising $N_2O$ or $O_2$.

12. The method according to claim 1, further comprising nitriding or nitride-oxidizing the surface of the gates insulation film by performing an annealing process at 650 to 950° C. in an atmosphere of $NH_3$, $N_2/H_2$ or $N_2O$ by using an electric furnace or a rapid thermal treatment, after depositing the TaON film.

13. The method according to claim 10, wherein a SiN film or SiON film is obtained by the nitriding process or the nitride-oxidizing process and a thickness of the SiN film or the SiON film ranges from 5 to 20 Å.

14. The method according to any one of claim 10–12, wherein the surface of the TaON film is oxidized or crystallized in an atmosphere of $O_2$ and $H_2$ by fixing a flow rate of the $O_2/H_2$ gas below 3.

15. The method according to claim 1, wherein the first conductive film for a floating gate and the second conductive film for a control gate are respectively formed by depositing a doped polysilicon or a metal material, or stacking the doped polysilicon and the metal material.

16. The method according to claim 15, wherein the metal material is selected from the group consisting of TiN, TaN, W, WN, WSi, Ru, $RuO_2$, Ir, $IrO_2$ and Pt.

17. The method according to claim 15, further comprising a hemispherical grain polysilicon growth process, when the conductive film for the floating gate consists of a polysilicon.

18. A method for forming a gate electrode of a flash memory, comprising:

providing a semiconductor substrate;

forming a tunnel oxide film on the whole surface of the semiconductor substrate;

forming a conductive film for a floating gate on the tunnel oxide film;

nitriding or nitride-oxidizing the surface of the conductive film for the floating gate, before depositing a TaON film;

forming the TaON film on the nitrided or nitride-oxidized conductive film for the floating gate;

nitriding or nitride-oxidizing the surface of the conductive film for the floating gate, after depositing the TaON film;

crystallizing the nitrided or nitride-oxidized TaON film by annealing at 600 to 950° C. in an atmosphere of $N_2O$ or $O_2$ by using an electric furnace or plasma in in-situ or ex-situ; forming a conductive film for a control gate on the TaON film; and forming a gate electrode, by patterning the conductive film for the control gate, the TaON film, the conductive film for the floating gate and the tunnel oxide film.

* * * * *